US006904552B2

United States Patent
Cowles (10) Patent No.: US 6,904,552 B2
(45) Date of Patent: Jun. 7, 2005

(54) CIRCUIT AND METHOD FOR TEST AND REPAIR

(75) Inventor: Timothy B. Cowles, Boise, ID (US)

(73) Assignee: Micron Technolgy, Inc., Boise, ID (US)

( * ) Notice: Subject to any disclaimer, the term of this patent is extended or adjusted under 35 U.S.C. 154(b) by 576 days.

(21) Appl. No.: 09/810,366

(22) Filed: Mar. 15, 2001

(65) Prior Publication Data

US 2002/0133767 A1 Sep. 19, 2002

(51) Int. Cl.$^7$ ............................................. G11C 29/00
(52) U.S. Cl. ................... 714/719; 714/723; 365/189.01
(58) Field of Search ....................... 365/189.01, 189.04, 365/189.05, 190, 220, 221, 200, 201; 714/710, 711, 718, 719, 723, 725, 733, 734, 735, 5, 7, 8, 42

(56) References Cited

U.S. PATENT DOCUMENTS

| | | | |
|---|---|---|---|
| 5,457,789 A | 10/1995 | Dietrich, Jr. et al. ....... 711/100 |
| 5,490,042 A | 2/1996 | Perkins ........................ 361/778 |
| 5,528,539 A | 6/1996 | Ong et al. .................... 365/200 |
| 5,577,055 A | 11/1996 | Westerlund ................. 714/805 |
| 5,655,105 A | 8/1997 | McLaury .................... 395/496 |
| 5,706,292 A | 1/1998 | Merritt ........................ 714/710 |
| 5,724,282 A | 3/1998 | Loughmiller et al. ......... 365/96 |
| 5,724,366 A | 3/1998 | Furutani .................... 371/21.2 |
| 5,748,543 A | 5/1998 | Lee et al. .................... 365/200 |
| 5,883,843 A | 3/1999 | Hii et al. ..................... 365/201 |
| 5,910,921 A | 6/1999 | Beffa et al. ................. 365/201 |
| 5,917,764 A | 6/1999 | Ohsawa et al. ............. 365/200 |
| 5,946,245 A * | 8/1999 | Brown et al. ................ 365/201 |
| 5,959,929 A | 9/1999 | Cowles et al. ......... 365/230.03 |
| 6,018,811 A | 1/2000 | Merritt ........................ 714/711 |
| 6,088,282 A | 7/2000 | Loughmiller et al. .... 365/225.7 |
| 6,104,645 A | 8/2000 | Ong et al. ................... 365/200 |
| 6,115,828 A | 9/2000 | Tsutsumi et al. ............... 714/7 |
| 6,119,251 A | 9/2000 | Cloud et al. ................. 714/718 |
| 6,130,834 A | 10/2000 | Mullarkey et al. ............. 365/96 |
| 6,144,593 A | 11/2000 | Cowles et al. .............. 365/200 |
| 6,145,092 A | 11/2000 | Beffa et al. ...................... 714/7 |
| 6,154,398 A | 11/2000 | Cutter et al. ................ 365/200 |
| 6,154,851 A | 11/2000 | Sher et al. ...................... 714/5 |
| 6,163,860 A | 12/2000 | Merritt ........................ 714/711 |
| 6,246,618 B1 | 6/2001 | Yamamoto et al. ......... 365/200 |

(Continued)

OTHER PUBLICATIONS

Micron Technology, Inc.; "Synchronous DRAM" Data Sheets; 128Mb: x4, x8, x16 SDRAM, 128MSDRAM_*Rev B_*, p65; Pub. Oct. 2000, pp. 1–58.

Micron Technology, Inc.; "Synchronous DRAM" Data Sheets; 128Mb: x32 SDRAM, 128Mb: x32 DRAM, 128MbSDRAMx32, p65—Rev. Sep. 2000, pp.1–52.

*Primary Examiner*—Christine T. Tu
(74) *Attorney, Agent, or Firm*—Charles Brantley (57) ABSTRACT

A preferred exemplary embodiment of the current invention concerns a memory testing process, wherein circuitry is provided on a chip to allow on-chip comparison of stored data and expected data. The on-chip comparison allows the tester to transmit in a parallel manner the expected data to a plurality of chips. In a preferred embodiment, at most one address—and only the column address—corresponding to a failed memory cell is stored in an on-chip register at one time, with each earlier failed addresses being cleared from the register in favor of a subsequent failed address. Another bit—the "fail flag" bit—is stored in the register to indicate that a failure has occurred. If the fail flag is present in a chip, that chip is repaired by electrically associating the column address with redundant memory cells rather than the original memory cells. Subsequently, the chip's register may be cleared and testing may continue. It is preferred that the register and related logic circuitry be configured to avoid storing an address that is already associated with a redundant cell, even though that redundant cell has failed.

6 Claims, 6 Drawing Sheets

U.S. PATENT DOCUMENTS

| | | | |
|---|---|---|---|
| 6,249,893 B1 | 6/2001 | Rajsuman et al. | 714/741 |
| 6,259,639 B1 * | 7/2001 | Hashizume | 365/201 |
| 6,320,804 B2 * | 11/2001 | Dahn | 365/201 |
| 6,393,504 B1 | 5/2002 | Leung et al. | 710/104 |
| 6,396,300 B1 | 5/2002 | Loughmiller et al. | 326/16 |
| 6,417,695 B1 | 7/2002 | Duesman | 326/47 |
| 6,418,069 B2 | 7/2002 | Schamberger et al. | 365/200 |
| 6,550,023 B1 * | 4/2003 | Brauch et al. | 714/42 |
| 6,560,728 B2 | 5/2003 | Merritt | 714/711 |
| 2001/0017806 A1 | 8/2001 | Schamberger et al. | 365/202 |

* cited by examiner

FIG. 1
(PRIOR ART)

| | CLOCK CYCLE<br>PRIOR ART TEST METHOD | CLOCK CYCLE<br>EXEMPLARY TEST METHOD |
|---|---|---|
| 1 | WRITE TO 1ST ADDR OF CHIPS A, B, C, & D | WRITE TO 1ST ADDR OF CHIPS A, B, C, & D |
| 2 | WRITE TO 2ND ADDR OF CHIPS A, B, C, & D | WRITE TO 2ND ADDR OF CHIPS A, B, C, & D |
| 3 | WRITE TO 3RD ADDR OF CHIPS A, B, C, & D | WRITE TO 3RD ADDR OF CHIPS A, B, C, & D |
| 4 | WRITE TO 4TH ADDR OF CHIPS A, B, C, & D | WRITE TO 4TH ADDR OF CHIPS A, B, C, & D |
| 5 | READ FROM 1ST ADDR OF CHIP A | READ FROM 1ST ADDR OF CHIPS A, B, C, & D |
| 6 | READ FROM 2ND ADDR OF CHIP A | READ FROM 2ND ADDR OF CHIPS A, B, C, & D |
| 7 | READ FROM 3ND ADDR OF CHIP A | READ FROM 3RD ADDR OF CHIPS A, B, C, & D |
| 8 | READ FROM 4TH ADDR OF CHIP A | READ FROM 4TH ADDR OF CHIPS A, B, C, & D |
| 9 | READ FROM 1ST ADDR OF CHIP B | READ FAIL FLAG FROM A |
| 10 | READ FROM 2ND ADDR OF CHIP B | READ FAIL FLAG FROM B |
| 11 | READ FROM 3RD ADDR OF CHIP B | READ FAIL FLAG FROM C |
| 12 | READ FROM 4TH ADDR OF CHIP B | READ FAIL FLAG FROM D |
| 13 | READ FROM 1ST ADDR OF CHIP C | |
| 14 | READ FROM 2ND ADDR OF CHIP C | |
| 15 | READ FROM 3RD ADDR OF CHIP C | |
| 16 | READ FROM 4TH ADDR OF CHIP C | |
| 17 | READ FROM 1ST ADDR OF CHIP D | |
| 18 | READ FROM 2ND ADDR OF CHIP D | |
| 19 | READ FROM 3RD ADDR OF CHIP D | |
| 20 | READ FROM 4TH ADDR OF CHIP D | |

| | CLOCK CYCLE<br>PRIOR ART TEST METHOD | CLOCK CYCLE<br>EXEMPLARY TEST METHOD |
|---|---|---|
| 1 | WRITE TO 1ST ADDR OF CHIPS A, B, C, & D | WRITE TO 1ST ADDR OF CHIPS A, B, C, & D |
| 2 | WRITE TO 2ND ADDR OF CHIPS A, B, C, & D | WRITE TO 2ND ADDR OF CHIPS A, B, C, & D |
| 3 | WRITE TO 3RD ADDR OF CHIPS A, B, C, & D | WRITE TO 3RD ADDR OF CHIPS A, B, C, & D |
| 4 | WRITE TO 4TH ADDR OF CHIPS A, B, C, & D | WRITE TO 4TH ADDR OF CHIPS A, B, C, & D |
| 5 | WRITE TO 5TH ADDR OF CHIPS A, B, C, & D | WRITE TO 5TH ADDR OF CHIPS A, B, C, & D |
| 6 | READ FROM 1ST ADDR OF CHIP A | READ FROM 1ST ADDR OF CHIPS A, B, C, & D |
| 7 | READ FROM 2ND ADDR OF CHIP A | READ FROM 2ND ADDR OF CHIPS A, B, C, & D |
| 8 | READ FROM 3RD ADDR OF CHIP A | READ FROM 3RD ADDR OF CHIPS A, B, C, & D |
| 9 | READ FROM 4TH ADDR OF CHIP A | READ FROM 4TH ADDR OF CHIPS A, B, C, & D |
| 10 | READ FROM 5TH ADDR OF CHIP A | READ FROM 5TH ADDR OF CHIPS A, B, C, & D |
| 11 | READ FROM 1ST ADDR OF CHIP B | READ FAIL FLAG FROM A |
| 12 | READ FROM 2ND ADDR OF CHIP B | READ FAIL FLAG FROM B |
| 13 | READ FROM 3RD ADDR OF CHIP B | READ FAIL FLAG FROM C |
| 14 | READ FROM 4TH ADDR OF CHIP B | READ FAIL FLAG FROM D |
| 15 | READ FROM 5TH ADDR OF CHIP B | |
| 16 | READ FROM 1ST ADDR OF CHIP C | |
| 17 | READ FROM 2ND ADDR OF CHIP C | |
| 18 | READ FROM 3RD ADDR OF CHIP C | |
| 19 | READ FROM 4TH ADDR OF CHIP C | |
| 20 | READ FROM 5TH ADDR OF CHIP C | |
| 21 | READ FROM 1ST ADDR OF CHIP D | |
| 22 | READ FROM 2ND ADDR OF CHIP D | |
| 23 | READ FROM 3RD ADDR OF CHIP D | |
| 24 | READ FROM 4TH ADDR OF CHIP D | |
| 25 | READ FROM 5TH ADDR OF CHIP D | |

FIG. 4

| | CLOCK CYCLE PRIOR ART TEST METHOD | CLOCK CYCLE EXEMPLARY TEST METHOD |
|---|---|---|
| 1 | WRITE TO 1ST ADDR OF CHIPS A, B, C, D, & E | WRITE TO 1ST ADDR OF CHIPS A, B, C, D, & E |
| 2 | WRITE TO 2ND ADDR OF CHIPS A, B, C, D, & E | WRITE TO 2ND ADDR OF CHIPS A, B, C, D, & E |
| 3 | WRITE TO 3RD ADDR OF CHIPS A, B, C, D, & E | WRITE TO 3RD ADDR OF CHIPS A, B, C, D, & E |
| 4 | WRITE TO 4TH ADDR OF CHIPS A, B, C, D, & E | WRITE TO 4TH ADDR OF CHIPS A, B, C, D, & E |
| 5 | READ FROM 1ST ADDR OF CHIP A | READ FROM 1ST ADDR OF CHIPS A, B, C, D, & E |
| 6 | READ FROM 2ND ADDR OF CHIP A | READ FROM 2ND ADDR OF CHIPS A, B, C, D, & E |
| 7 | READ FROM 3RD ADDR OF CHIP A | READ FROM 3RD ADDR OF CHIPS A, B, C, D, & E |
| 8 | READ FROM 4TH ADDR OF CHIP A | READ FROM 4TH ADDR OF CHIPS A, B, C, D, & E |
| 9 | READ FROM 1ST ADDR OF CHIP B | READ FAIL FLAG FROM A |
| 10 | READ FROM 2ND ADDR OF CHIP B | READ FAIL FLAG FROM B |
| 11 | READ FROM 3RD ADDR OF CHIP B | READ FAIL FLAG FROM C |
| 12 | READ FROM 4TH ADDR OF CHIP B | READ FAIL FLAG FROM D |
| 13 | READ FROM 1ST ADDR OF CHIP C | READ FAIL FLAG FROM E |
| 14 | READ FROM 2ND ADDR OF CHIP C | |
| 15 | READ FROM 3RD ADDR OF CHIP C | |
| 16 | READ FROM 4TH ADDR OF CHIP C | |
| 17 | READ FROM 1ST ADDR OF CHIP D | |
| 18 | READ FROM 2ND ADDR OF CHIP D | |
| 19 | READ FROM 3RD ADDR OF CHIP D | |
| 20 | READ FROM 4TH ADDR OF CHIP D | |
| 21 | READ FROM 1ST ADDR OF CHIP E | |
| 22 | READ FROM 2ND ADDR OF CHIP E | |
| 23 | READ FROM 3RD ADDR OF CHIP E | |
| 24 | READ FROM 4TH ADDR OF CHIP E | |

CIRCUIT AND METHOD FOR TEST AND REPAIR

TECHNICAL FIELD

The present invention relates generally to the computer memory field and, more specifically, to test and repair of memory.

BACKGROUND OF THE INVENTION

A memory device is often produced using a semiconductor fabrication process. In the current application, the term "semiconductor" will be understood to mean any semiconductor material, including but not limited to bulk semiconductive materials (either alone or in assemblies comprising other materials thereon), and semiconductive material layers (either alone or in assemblies comprising other materials). Moreover, it shall be understood that a semiconductor device may comprise conductive and insulative materials as well as a semiconductive material. The result of a semiconductor process may be a die comprising memory circuitry, and it may be desirable to test that circuitry at some point during the process of constructing a memory device comprising that die. For instance, testing may occur while the die is part of a semiconductor wafer, after singulation from the wafer, during die packaging, or once the memory device (chip) is completed.

One conventional method of testing such a chip is to have an external testing device write data to every memory cell of the chip, then read data from every memory cell, and compare the input with the output. Such a comparison may reveal cells that failed to store the data properly. The addresses corresponding to these defective cells can be stored by the external testing device, and that stored data may be used to repair the chip. In order to effect such repair, redundant cells are provided on the chip, as well as at least one bank of fuses or anti-fuses that controls access to the redundant cells. Assuming the bank to be comprised of anti-fuses, repair circuitry receives each address corresponding to a defective cell and, based on that address, blows at least one anti-fuse, thereby isolating the defective cell and associating the address with a redundant cell.

This error detect and repair scheme, however, raises issues. One such issue is the number of chips that may be tested at one time. A typical testing device is an AMBYX machine which can hold 256 chips. However, for cost reasons, the AMBYX has only 64 terminals (known as "DQ's" ) for reading from and writing to the chips. As a result, the chips must share these DQ resources. Assuming each chip has only four DQ's of its own (in which case the chips would be known as a "×4" part), then the AMBYX could access only 16 chips at one time. Thus a typical testing process would involve writing data to cells of 16 chips; reading data from cells of all 16 chips; comparing the written data with the read data; and, for cells wherein the written data and read data do not match, storing the addresses of those failed cells. These steps must be performed 15 more times in order to test all 256 chips on the AMBYX. Moreover, once repaired, the chips are often retested in a second test cycle to determine whether the repair was successful, thereby requiring even more time, especially if the chips must be removed from the AMBYX for repair and then placed back onto the AMBYX for retesting. Further, more than one type of test is often conducted. As a result, there is a desire in the art to shorten test time.

SUMMARY OF THE INVENTION

Accordingly, exemplary embodiments of the current invention provide methods and circuitry for testing and repairing a chip. In one exemplary embodiment, data stored on a chip's memory is read to the extent that it is accessed from the memory array. However, rather than transmit the data to an external testing device, the chip's output circuitry is tri-stated, the external testing device transmits to the chip the data that is expected to be stored, and a comparison between the stored data and the expect data occurs on chip.

In another embodiment, a result of a test, be it one described above or another, are stored on the chip. In a preferred embodiment, at most one failed address is stored, along with a bit indicating that a failure has been found. In a more preferred embodiment, the stored address is the last failed address resulting from the test; and only the column address, rather than both the column and row address, is stored. In another embodiment, the register of a failed part is cleared after testing, and further testing commences. If such testing reveals a failed address already associated with a redundant cell, that address is not stored, although a bit indicating that a failure has been found is stored.

In yet another embodiment, chip repair is carried out wherein, given a defective memory cell, an entire group of memory cells including the defective cell is replaced by a redundant group of cells. In a preferred embodiment of this type, an entire column of redundant memory cells replaces a column of memory cells containing the defective cell. In a more preferred embodiment, the address of the defective memory cell is stored in an on-chip register. In an even more preferred embodiment, only one column—the column including the last recorded failed memory cell—is replaced as a result of one test cycle.

These and other embodiments within the scope of the invention include within the scope both apparatuses and methods; and still other embodiments encompass combinations of the embodiments listed above.

DETAILED DESCRIPTION OF THE PREFERRED EMBODIMENTS

Figure 1:
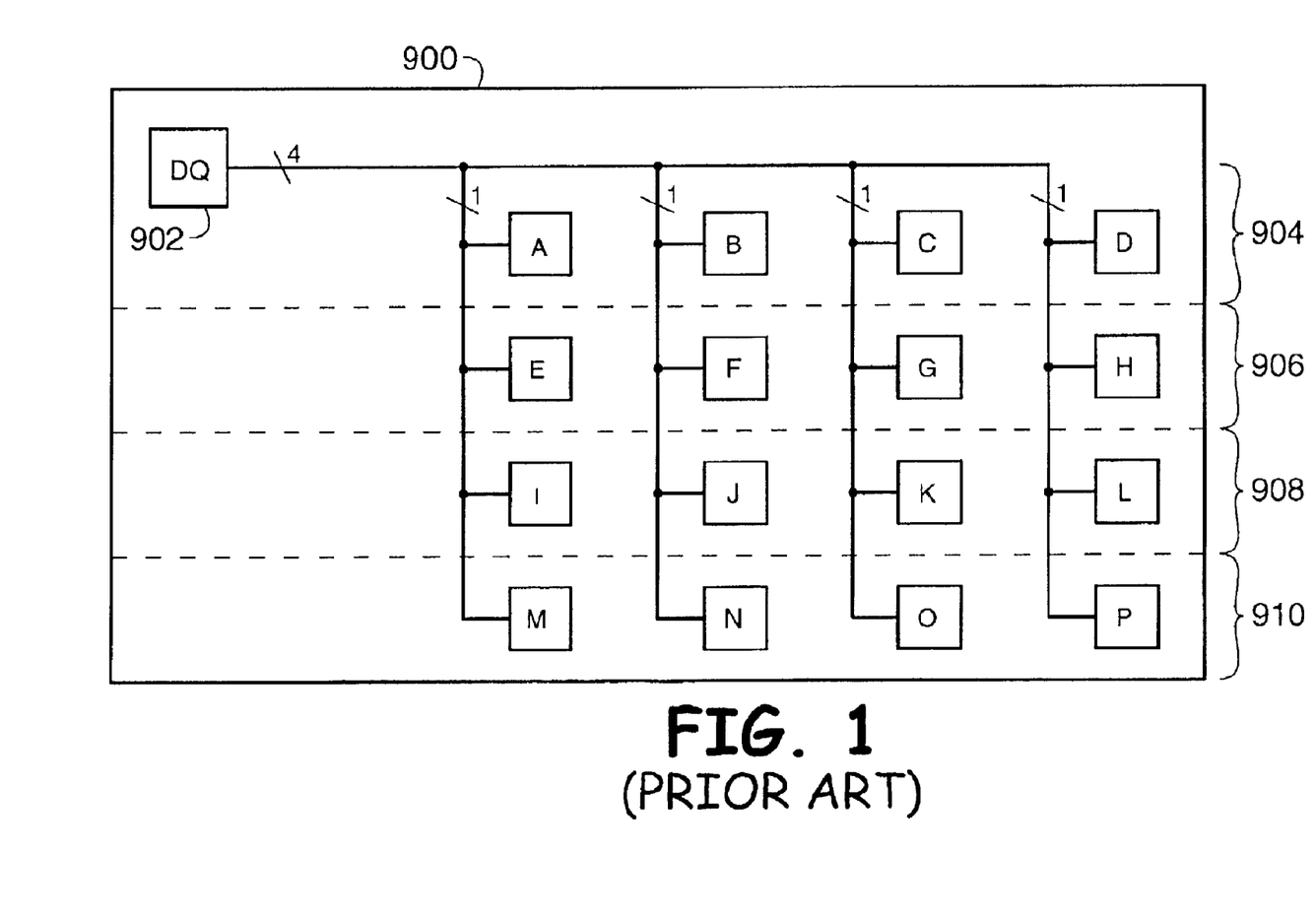
FIG. 1 depicts a prior art testing device for a plurality of chips.

In terms of error detection, exemplary embodiments of the current invention shorten test time by presenting a testing scheme alternative to the one presented in the Background. To begin with, a simplified test method practiced in the prior art is presented. FIG. 1 presents a portion of a simplified tester 900 having only four DQ's 902. While the tester 900 may be able to physically hold 16 chips (A–P), its circuitry is designed to direct signals to and from at most four chips at one time. It is understood that the tester 900 also has conductive lines (not shown) that carry address and command information to the chips, and that these lines are also limited in number and so can direct signals to and from at most four chips at a time. The areas in which the tester may communicate in such a fashion are identified in this specification as "regions." Tester 900 has four regions 904, 906, 908, and 910. Further, it is assumed for purposes of explanation that the parts A–P are "×1" parts (each having only one DQ) and have only four memory addresses.

Figure 2:
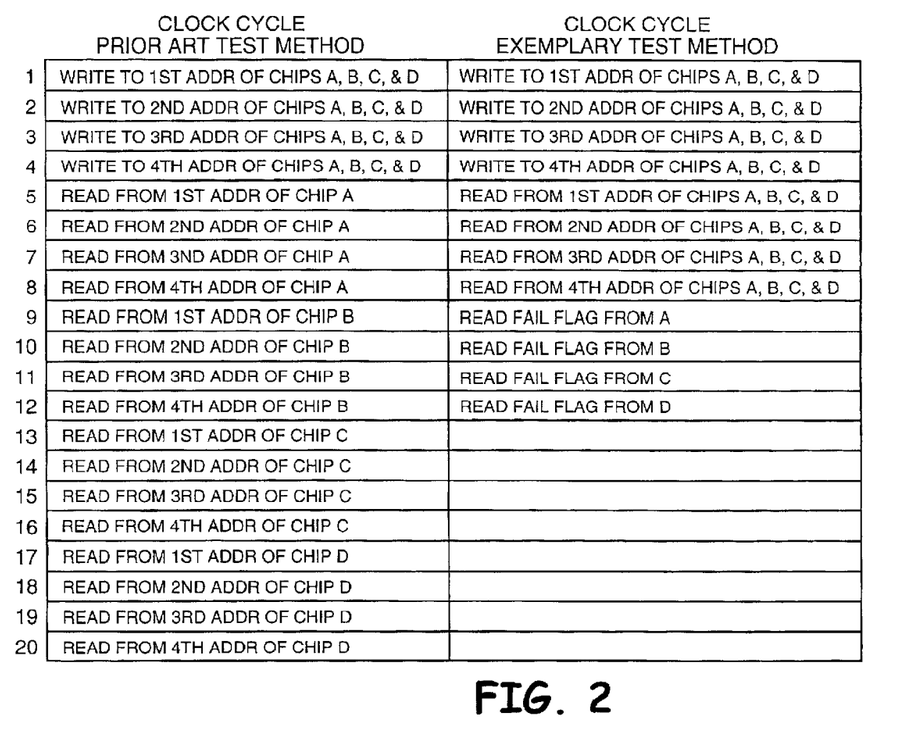
FIG. 2 is a table comparing a test method known in the art with an exemplary method within the scope of the current invention.

The prior art commands for one exemplary test using tester 900 are depicted in the left-hand column of the table in FIG. 2. During the first clock cycle, the same bit is written to a cell corresponding to the first address in each of chips A–D. Because the same bit is being written, the write step may occur in parallel with respect to chips A–D. Similar parallel writing steps may be taken to write to the second, third, and fourth addresses of chips A–D. As a result, writing to every address of all four chips requires 4 clock cycles. However, reading from the chips A–D for purposes of off-chip comparison with expected data may not be performed in parallel, as the chips may not output identical data due to chip failures which this test seeks to reveal. As a result, the tester must read from each address in each chip in series. Table 1 indicates that reading from all four addresses of chip A requires four clock cycles (5–8). In fact, four clock cycles are required to read from all addresses of each chip, resulting in a total of twenty clock cycles needed to test the four chips 20 in this one region 904 of the tester 900. An additional 20 clock cycles is then needed for each of the remaining regions 906, 908, 910. Thus in this example, test time takes 80 clock cycles, and that amount is just for one test. Generally several tests are performed on the chips, with each test requiring 80 clock cycles. Moreover, chips that failed a test the first time often repeat that test after being repaired, thereby requiring even more test time. One can now appreciate the degree to which the required test time can multiply.

Figure 3:
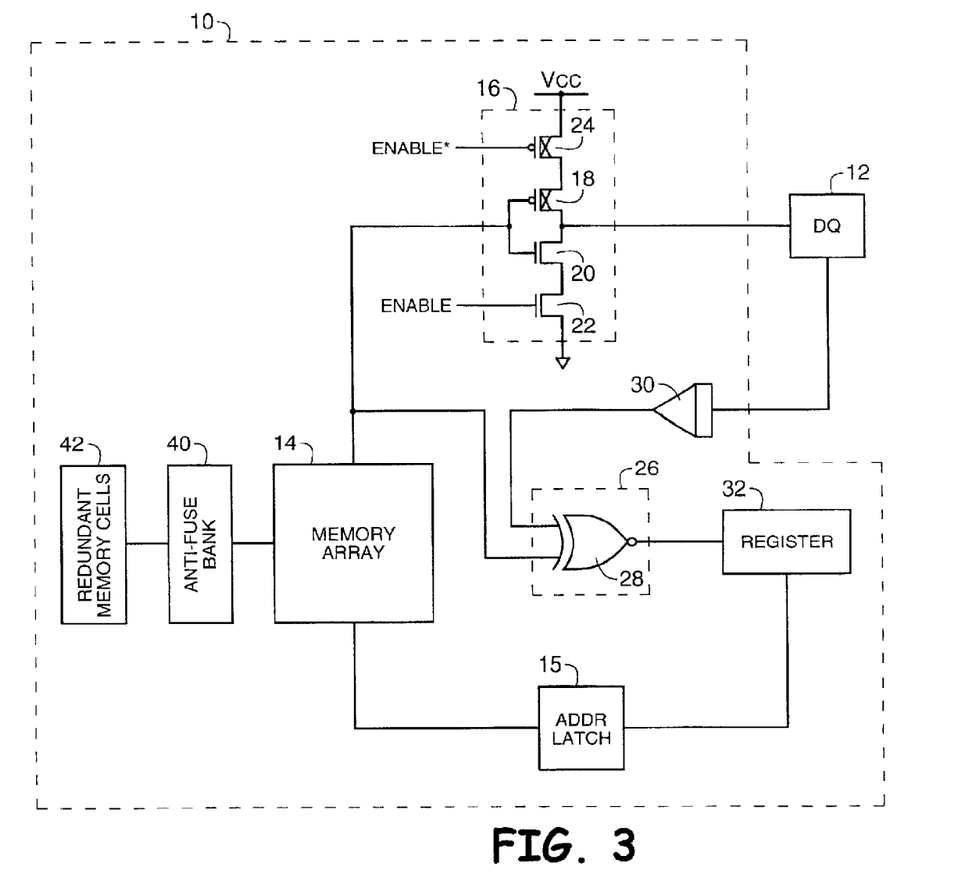
FIG. 3 illustrates circuitry of an exemplary apparatus embodiment within the scope of the current invention.

At least one exemplary embodiment of the current invention affects the time required to perform such a test. Such an embodiment is depicted in FIG. 3, which illustrates a semiconductor die as part of a chip 10 and a DQ 12 of a tester. Chip 10 includes a memory array 14; an address latch 15 that is configured to transmit a memory address (and may further comprise a separate row address latch and column address latch); an anti-fuse bank 40 which, based on its programming state, may divert a signal for a cell in the memory array to one of the redundant memory cells 42; and output circuitry 16. The output circuitry 16 is connected to the memory array 14 and the DQ 12. Output circuitry 16 comprises four transistors 18, 20, 22, and 24. The gates of p-channel transistor 18 and n-channel transistor 20 are connected to each other and to the memory array 14. Their drains are also connected to each other and to DQ 12. N-channel transistor 22 is coupled to ground and to transistor 20 and is driven by a signal ENABLE. A complementary signal ENABLE* drives transistor 24, which is coupled to a voltage source Vcc and to transistor 18.

In a standard read operation, the ENABLE signal represents a high voltage signal that turns on transistor 22. Accordingly, the ENABLE* signal represents a low voltage signal that turns on transistor 24. A data value from at least one cell in memory array 14 (designated by the address in the address latch 15) is transmitted to the gates of transistors 18 and 20, and an inverted signal is output from their drains to the DQ 12. However, in a test mode under an exemplary embodiment of the current invention, ENABLE is at low voltage. As a result, transistor 22 turns off (isolating the output circuitry 16 from ground), ENABLE* is at a high voltage, and transistor 24 turns off (isolating the output circuitry 16 from Vcc). The state of the output circuitry 16 in this mode is known as a "tri-state." The data value from memory cell 14 nevertheless transmits to an on-chip comparison circuit 26, which, in this example, is an exclusive NOR gate 28 that receives both the data from the memory array 14 and the data transmitted from the tester's DQ 12 (it is preferred, although not required, that the signal from DQ 12 first pass through an input buffer 30). Although the output circuitry 16 has been tri-stated and data is being transmitted to the chip 10 through the DQ 12, the chip 10 is considered to be in a "read" mode given that the data stored on chip 10 is being accessed. Based on the truth table for an EXCLUSIVE NOR operation, the EXCLUSIVE NOR gate 28 will output a low voltage signal only when both inputs fail to match, thereby indicating a defect in the cell corresponding to the memory address. The low voltage output from the EXCLUSIVE NOR gate prompts the register 32 to store the memory address transmitted by the address latch 15. Moreover, it is also preferable (although not required) for purposes of further testing as discussed below that the register 32 also store a bit that indicates whether an error has been found. For purposes of explaining other exemplary embodiments of the current invention, this bit will be referred to as the "fail flag."

The right column of FIG. 2 illustrates that using the circuitry described above allows for an exemplary method of testing chips A–P on FIG. 1's tester 900 with fewer steps than was used in the prior art. As in the prior art, a particular bit may be written to every chip in a region in a parallel manner. Thus, writing to the first address of chips A–D can be performed in the same clock cycle, as can writing to the second, third, and fourth addresses. While writing to chips A–D takes the same number of clock cycles as in the prior art, the savings in this exemplary testing method appear when the chips enter their "read" mode.

Unlike the prior art test, the tester's DQ's 902 are not needed to serially transmit possibly differing data from chips A–D. This is because analysis of the chips' stored data occurs within each chip. Thus, the tester's DQ's 902 may now be used to transmit to chips A–D the data that is expected to be stored in the first address on those chips. Because the data written to the first address is the same for chips A–D, the expected data is also the same, and that expected data may be therefore transmitted by the tester in a parallel fashion. As a result, only one clock cycle is used to test the first address in chips A–D. A mismatch between the expected data and the data read from the first address of any of the chips A–D suggests a defective memory cell. In that event, the first address of the relevant chip would be stored in its register 32 along with data—such as the fail flag—indicating that at least one error has been found on that chip.

Subsequently, the second address of chips A–D is read during the next clock cycle and compared with the expected data, and so on for the third and fourth addresses, with the failed addresses being stored in the appropriate register 32 accordingly. As a result, this exemplary testing method accomplishes in eight clock cycles what it took the prior art twenty clock cycles to accomplish. Even after adding the preferred steps of serially reading for the fail flag that could result from the on-chip comparisons, clock cycle savings are still realized in comparison to the prior art method. It is further preferred that the circuit in FIG. 3 and process of FIG. 2 be implemented with chips that exhibit a latency of 1 or 2, wherein latency indicates the delay in the number of clock cycles between the arrival of a "read" command and the availability of data to be read.

Moreover, it should be remembered that the example is a relatively simple one, with each chip having only four addresses and the tester 900 being able to test only four chips at once. As discussed in the background section, it is not unusual to test chips having millions of addresses per chip and to test them sixteen at a time. The savings offered by the exemplary method embodiment disclosed above become even greater with added complexity of the test scheme.

Figure 4:
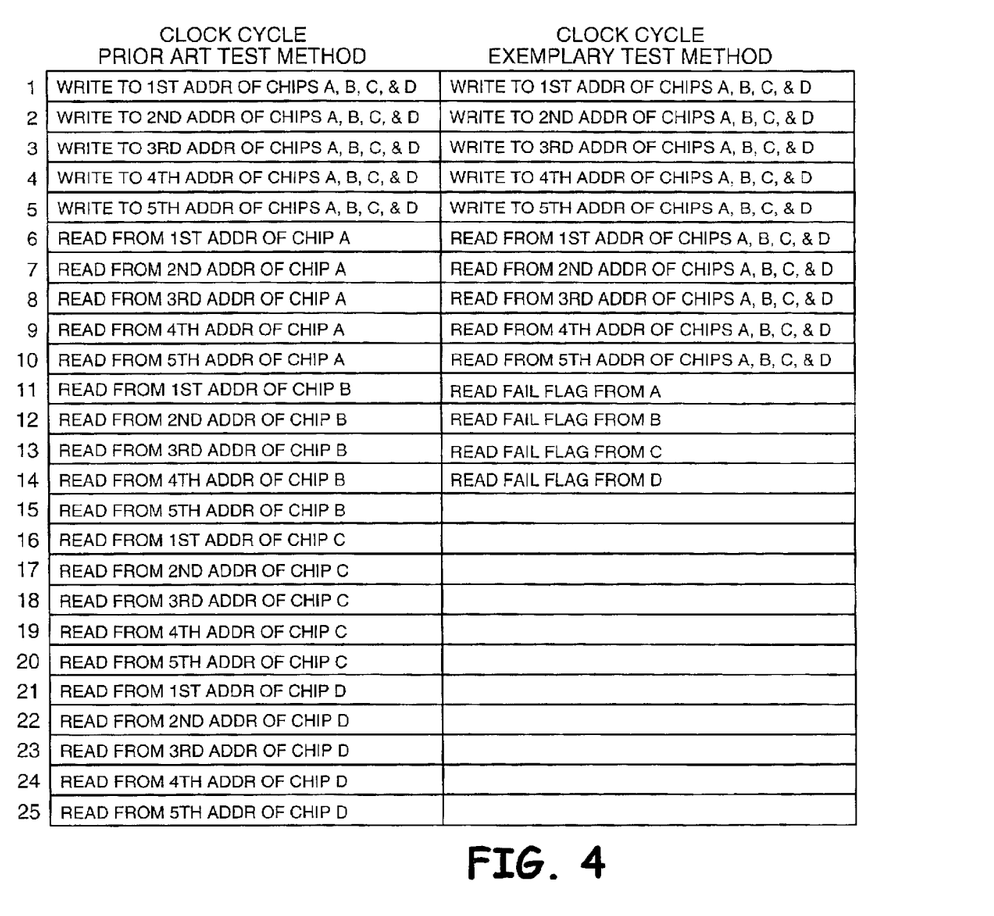
FIG. 4 is a table comparing a second test method known in the art with a second exemplary method within the scope of the current invention.

For instance, assuming that chips A–P had five addresses rather than four, the table in FIG. 4 illustrates that the prior art test of region 904 would require five additional clock cycles: one clock cycle for a parallel write command to the fifth address of chips A–D; and four clock cycles, each needed to read from the fifth address of each chip A–D. In contrast, the exemplary method could use only two additional clock cycles: one clock cycle for a parallel write command and one clock cycle for a parallel read command.

Figure 5:
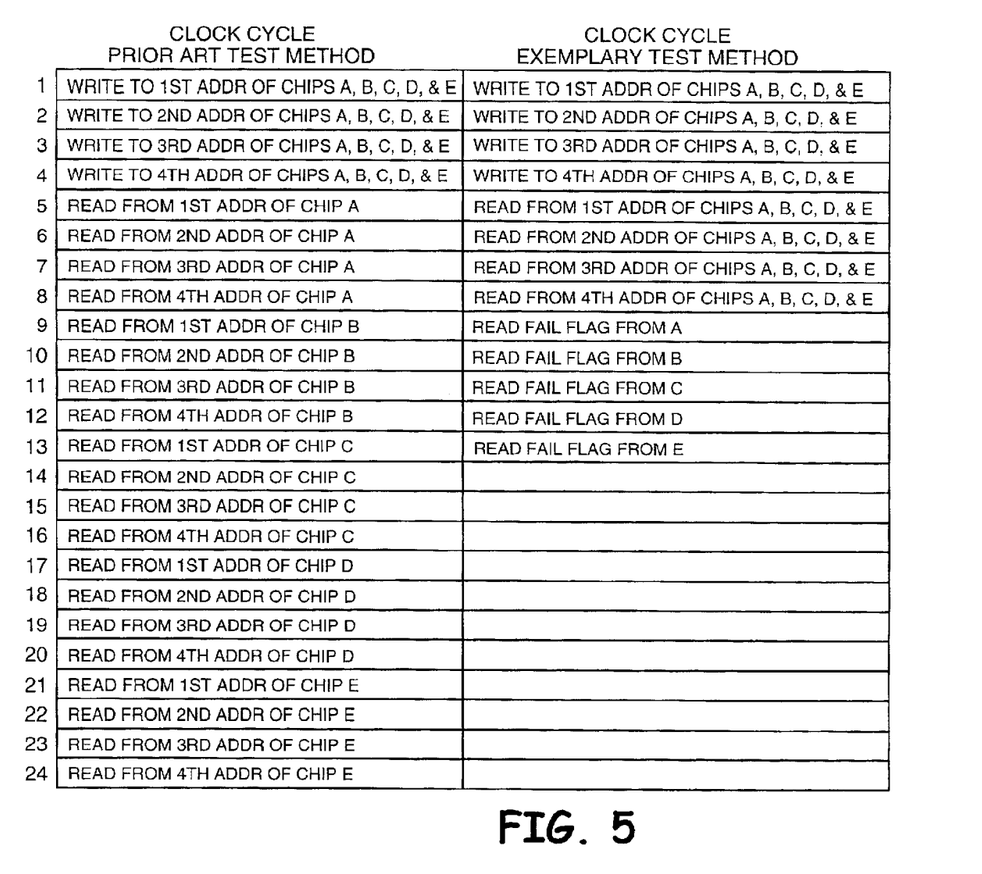
FIG. 5 is a table comparing a third test method known in the art with a third exemplary method within the scope of the current invention.

Another example illustrated in the table of FIG. 5 assumes that five chips (each having four addresses) could be tested in parallel rather than four chips. The prior art method would require four more clock cycles to read from the four addresses of that extra part, whereas the exemplary method would require only one extra clock cycle to read the fail flag from the extra part; reading from all addresses of chip E requires no additional clock cycles, as that can be performed in the same clock cycle for reading from the other chips.

As a result, one can now appreciate that an increase in the chips per region, the number of regions, the number of tests, or the number of bits per chip results in a multiplied amount of clock cycle savings during testing using exemplary embodiments of the current invention. Such savings can result in shorter test time or allow more time for other tests. In fact, testing directed by the inventor using exemplary embodiments of the current invention has demonstrated a reduction in test time by 45%.

The preferred number of failed address to be stored in register 32 can be based on balancing the desire to fabricate as small a chip as possible with the desire to increase the likelihood of being able to keep track of all addresses corresponding to defective cells after one test cycle. The greater amount of on-chip test circuitry (including a large register capable of storing many failed addresses and the supporting logic circuitry), the more likely it is to ensure such ability. The cost, however, is that a great amount of die space may be devoted to that. Conversely, a lesser amount of on-chip test circuitry (including a register capable of storing few failed addresses and less supporting logic circuitry) allows for less die space to be devoted at the cost of some ability to keep track of all failed addresses after one test cycle. Such a balancing has been made concerning Synchronous Dynamic Random Access Memory (SDRAM) parts recently fabricated by Micron Technology, Inc., including part numbers MT48LC32M4A2 (an 8 Meg×4×4 bank part), MT48LC16M8A2 (a 4 Meg×8×4 bank part), MT48LC8M16A2 (a 2 Meg×16×4 bank part), and MT48LC4M32B2 (a 1 Meg×32×4 bank part). These parts incorporate many of the exemplary embodiments of the current invention. An analysis of the failed cells found on these parts during testing revealed that 90% of the failed chips can be fully repaired by replacing only one column containing at least one defective cell with a redundant column. As a result, these parts have a register that stores only a single failed address at one time (preferably in addition to the fail flag), and that address is only the column address, without the row address. Accordingly, a relatively small failed address register and related logic circuitry is provided on-chip. Further, it is preferred that the register store the latest failed address, clearing any former address that may have been stored.

After the test, the chips containing defective cells may be repaired. Such chips will be identified by the presence of the fail flag value in the register 32 of relevant chips. Chips without the fail flag may bypass the repair process, thereby allowing the limited resources of the repair device to be devoted to the chips that need repair.

Once the chips have been repaired, they may undergo a repeat of the previous test. Alternatively, they and the chips that passed the previous test may be subjected to a different test. In such cases, the address and fail-flag value may be cleared from the repaired chips' registers 32 before testing continues, and the testing process proceeds as described above. Further testing may reveal a defect concerning an address wherein the originally associated column of cells has already been isolated in favor of a redundant column as a result of a prior repair. In some exemplary embodiments of the current invention, it is not desirable to include circuitry designed to isolate a one redundant column in favor of a second. Thus, although not required in every embodiment of the current invention, it is preferable in certain exemplary embodiments to avoid storing a failed address in register 32 if that address is already associated with a redundant cell. The status of the anti-fuses in the anti-fuse bank 40 can be used to determine if such is the case. If such a failure occurs, however, it is desirable to record the existence of the failure by storing the fail flag in register 32. Thus, if at the end of a test, the register 32 stores a fail flag with no address, that is an indication that a redundant cell has failed, and the chip may be handled accordingly.

Figure 6:
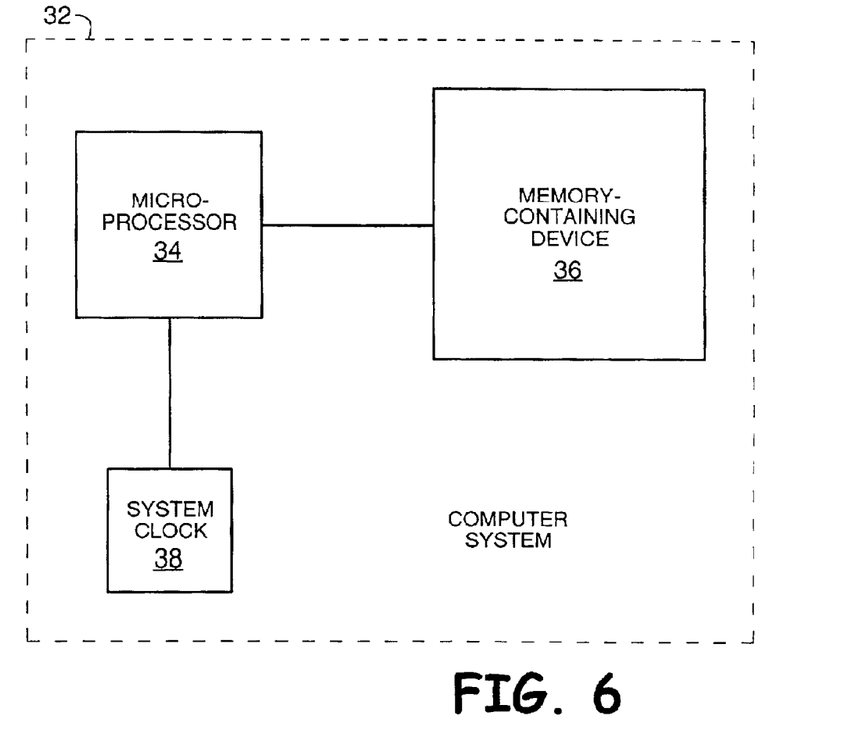
FIG. 6 depicts another exemplary apparatus embodiment within the scope of the current invention.

Exemplary embodiments of the current invention generally accommodate systems using memory, wherein the memory can include nonvolatile, static, or dynamic memory, and wherein the memory can be a discrete device, embedded in a chip with logic, or combined with other components to form a system on a chip. For example, FIG. 6 illustrates a computer system 32, wherein a microprocessor 34 transmits address, data, and control signals to a memory-containing device 36 such as one including but not limited to those described above. A system clock circuit 38 provides timing signals for the microprocessor 34.

One skilled in the art can appreciate that, although specific embodiments of this invention have been described above for purposes of illustration, various modifications may be made without departing from the spirit and scope of the invention. For example, the error detection methods described above may occur at any stage of die singulation, including but not limited to states in which the chip's die is part of a wafer, integral with at least one other die yet separate from a wafer, or completely singulated from all other die. Further, the error detection methods may occur at any stage of packaging, ranging from a bare die to a fully packaged chip, although it is preferred to carry out testing methods of the current invention with a fully packaged chip. Error detection methods can occur on any device capable of handling the chip based on its state of singulation or packaging, including AMBYX and TERADYNE devices. Error detection methods can occur during a test, probe, or bum-in (including cold burn-in) process. Concerning the function in at least some exemplary embodiments of storing a single defective address, it is not required under all exemplary embodiments of the current invention to store the last failed address. Rather, the current invention includes within its scope embodiments wherein the first failed address and only the first failed address (if any) is stored. Moreover, at least some error detection methods of the current invention may be used in either compression or non-compression data transfer test modes. Accordingly, the invention is not limited except as stated in the claims.

What is claimed is:

1. A circuit for a semiconductor chip including a memory array and an address latch, wherein said chip is configured to electrically communicate with a terminal of a tester, said circuit comprising:

a comparator on said semiconductor chip coupled to said memory array and to said terminal of said tester, wherein said comparator is configured to receive a first data value from said memory array and a second data value from said terminal and further configured to transmit a signal based upon a lack of identity between said first and second data values;

a register coupled to said address latch and to said comparator, wherein said first data value is associated with an address transmitted by said address latch, and wherein said register is configured to store said address in response to receiving said signal from said comparator, wherein said register is configured to store less than two addresses at one time, and wherein said register is configured to preferably store a later address corresponding to a later transmission of said signal over a prior address corresponding to a prior transmission of said signal; and an output circuit comprising:

an inverter coupled to said memory array, a first transistor electrically interposed between said inverter and a positive voltage source and configured to turn off during a test mode for said semiconductor chip, and a second transistor electrically interposed between said inverter and ground and configured to turn off during said test mode.

2. The circuit in claim 1, further comprising a buffer electrically interposed between said terminal and said comparator.

3. The circuit in claim 2, wherein said comparator comprises an exclusive nor gate.

4. The circuit in claim 1, wherein said inverter is configured to couple to said terminal.

5. The circuit in claim 4, wherein:

said inverter is further configured to transmit an output value to said terminal during a non-test mode, wherein said output value is based on data stored in said memory array;

said first transistor is configured to turn on in response to entering said non-test mode; and said second transistor is configured to turn on in response to entering said non-test mode.

6. The circuit in claim 5, wherein said output value is an inverse of said data stored in said memory array.

* * * * *

UNITED STATES PATENT AND TRADEMARK OFFICE
CERTIFICATE OF CORRECTION

PATENT NO. : 6,904,552 B2
DATED : June 7, 2005
INVENTOR(S) : Timothy B. Cowles

It is certified that error appears in the above-identified patent and that said Letters Patent is hereby corrected as shown below:

Title page,
Item [73], Assignee, "Micron Technolgy, Inc." should read -- Micron Technology, Inc. --.

Column 5,
Line 36, "address" should read -- addresses --; and

Column 6,
Line 60, "bum-in" should read -- burn-in --.

Signed and Sealed this

Seventh Day of February, 2006

JON W. DUDAS
*Director of the United States Patent and Trademark Office*